(12) United States Patent
Chida et al.

(10) Patent No.: US 11,692,248 B2
(45) Date of Patent: Jul. 4, 2023

(54) SLIDING MEMBER

(71) Applicant: NIPPON PISTON RING CO., LTD., Saitama (JP)

(72) Inventors: Noriaki Chida, Saitama (JP); Shota Seki, Saitama (JP)

(73) Assignee: NIPPON PISTON RING CO., LTD., Saitama (JP)

(*) Notice: Subject to any disclaimer, the term of this patent is extended or adjusted under 35 U.S.C. 154(b) by 0 days.

(21) Appl. No.: 16/768,371

(22) PCT Filed: Nov. 28, 2018

(86) PCT No.: PCT/JP2018/043853
§ 371 (c)(1),
(2) Date: May 29, 2020

(87) PCT Pub. No.: WO2019/107442
PCT Pub. Date: Jun. 6, 2019

(65) Prior Publication Data
US 2020/0299812 A1  Sep. 24, 2020

(30) Foreign Application Priority Data
Nov. 30, 2017  (JP) .................. 2017-230550

(51) Int. Cl.
*B21D 39/00* (2006.01)
*C22C 27/06* (2006.01)
(Continued)

(52) U.S. Cl.
CPC ............ *C22C 27/06* (2013.01); *C23C 14/024* (2013.01); *C23C 14/0641* (2013.01); *C23C 28/021* (2013.01); *F16J 9/26* (2013.01)

(58) Field of Classification Search
None
See application file for complete search history.

(56) References Cited

U.S. PATENT DOCUMENTS 6,139,984 A  10/2000 Onoda et al.
6,553,957 B1  4/2003 Ishikawa et al.
(Continued)

FOREIGN PATENT DOCUMENTS

JP  2000-001767 A  1/2000
JP  2001-335878 A  12/2001
(Continued)

OTHER PUBLICATIONS

International Search Report of PCT/JP2018/043853 dated Feb. 12, 2019 [PCT/ISA/210].
(Continued)

*Primary Examiner* — Seth Dumbris
*Assistant Examiner* — Kim S. Horger
(74) *Attorney, Agent, or Firm* — Sughrue Mion, PLLC

(57) ABSTRACT

To provide a sliding member, such as a piston ring for an internal combustion engine, having low friction and excellent toughness. The above-described problem is solved by a sliding member (10) such as a piston ring coated with a Cr—B—Ti—V—(Mn, Mo)—N-based alloy film (2) on a sliding surface (11) thereof, and configured so that the alloy film (2) contains one or both of Mn and Mo and has a total content of the Mn and the Mo within a range of 2 mass % or less. Preferably, a B content is within a range of 0.1 mass % to 1.5 mass %, inclusive, a V content is within a range of 0.05 mass % to 1 mass %, inclusive, and a Ti content is within a range of 0.05 mass % to 1.5 mass %, inclusive.

8 Claims, 13 Drawing Sheets

(51) Int. Cl.
　　　*C23C 14/02*　　　(2006.01)
　　　*C23C 14/06*　　　(2006.01)
　　　*C23C 28/02*　　　(2006.01)
　　　*F16J 9/26*　　　(2006.01)

(56) References Cited

U.S. PATENT DOCUMENTS

| | | | |
|---|---|---|---|
| 8,017,226 | B2 * | 9/2011 | Yamamoto .......... C23C 14/0641 |
| | | | 428/216 |
| 10,030,773 | B2 | 7/2018 | Stong et al. |
| 2009/0269614 | A1 | 10/2009 | Yamamoto et al. |
| 2017/0167609 | A1 | 6/2017 | Chida et al. |
| 2017/0254418 | A1 | 9/2017 | Stong et al. |

FOREIGN PATENT DOCUMENTS

| | | |
|---|---|---|
| JP | 2006-265646 A | 10/2006 |
| JP | 2009-263717 A | 11/2009 |
| WO | 01/33065 A1 | 5/2001 |
| WO | 2016/002810 A1 | 1/2016 |

OTHER PUBLICATIONS

Written Opinion of PCT/JP2018/043853 dated Feb. 12, 2019 [PCT/ISA/237].

Extended European Search Report dated Jul. 29, 2021, issued by the European Patent Office in application No. 18884064.9.

* cited by examiner

SLIDING MEMBER

FIELD OF THE INVENTION

The present invention relates to a sliding member, such as a piston ring for an internal combustion engine, having low friction and excellent toughness.

BACKGROUND ART

In association with the weight saving and increased output of automobile engine and the like, which are internal combustion engines, in recent years, a sliding member used under severe sliding conditions, in particular, a piston ring used in an internal combustion engine, is used under a severe environment of high temperature and high pressure, demanding further improvement in wear resistance and the like. For example, an outer peripheral sliding surface of the piston ring slides and comes into contact with an inner peripheral surface of a cylinder liner, demanding particularly excellent wear resistance. Thus, a chromium plating film, a nitrided layer, a hard film formed by a physical vapor deposition (PVD) method, or the like is used. Then, in response to the demand described above, a chromium plating film, a nitriding treatment film, a hard film such as chromium nitride (CrN, $Cr_2N$) and titanium nitride (TiN) made by a PVD method, or the like, is formed on the outer peripheral sliding surface and upper and lower surfaces of the piston ring.

However, in association with the weight saving and increased output of internal combustion engines in recent years, the piston ring is used under even more severe conditions. Therefore, a sliding member having excellent toughness and wear resistance is desired. In particular, a piston ring used in an internal combustion engine of an alcohol fuel vehicle capable of running on an alcohol fuel, or a flexible-fuel vehicle (FFV, a dual-fuel vehicle) capable of running on two or more types of fuels such as gasoline, methanol, and ethanol is susceptible to cracking and peeling of the wear resistant film, resulting in a desire for even higher toughness and wear resistance. The cracking and peeling of the wear resistant film is caused by a chemical reaction that occurs between the great amount of moisture generated from the alcohol contained in the fuel and the wear resistant film formed on the outer peripheral sliding surface of the piston ring.

In response to such demands, Patent Document 1, for example, proposes a sliding member coated with a hard film having improved sliding characteristics, in particular, peeling resistance. In this technique, the outer peripheral surface of the piston ring is coated with a hard film by arc ion plating, and the hard film is made of a CrN-type chromium nitride, and has a crystal lattice constant within a range of 0.4145 to 0.4200 nm and a Cr content of 30 to 49 atom %.

Further, Patent Document 2 proposes a sliding member coated with a film having excellent wear resistance, scuffing resistance, and characteristics without increasing the wear of an opposite material (aggressiveness against mated). In this technique, the outer peripheral surface of the sliding member is coated with a Cr—V—B—N alloy film, and the Cr—V—B—N alloy film is formed by a physical vapor deposition method, in particular, an ion plating method, a vacuum deposition method, or a sputtering method, and has a V content of 0.1 to 30 weight % and a B content of 0.05 to 20 weight %.

Further, Patent Document 3 proposes a sliding member on which a Cr—B—Ti—N alloy film having excellent wear resistance and scuffing resistance is formed. In this technique, the piston ring is configured by a parent material, a nitrided layer, and a Cr—B—Ti—N alloy film, and the Cr—B—Ti—N alloy film is configured to be coated on the outer peripheral sliding surface (sliding surface corresponding area) of the nitrided layer by a PVD method, and have a B content of 0.05 to 10.0 mass %, a Ti content of 5.0 to 40.0 mass %, an N content of 10.0 to 30.0 mass %, and a remnant of Cr.

Further, Patent Document 4 proposes a piston ring having even higher wear resistance, cracking resistance, and peeling resistance. In this technology, the piston ring is coated with a Cr—B—V—N-based alloy film on a sliding surface thereof, and configured so that a B content is within a range of 0.1 mass % to 1.5 mass %, inclusive, a V content is within a range of 0.05 mass % to 1 mass %, inclusive, and a ratio [B content/V content] is within a range greater than 1 and 30 or less.

PATENT DOCUMENTS

Patent Document 1: Japanese Laid-Open Patent Application No. 2001-335878
Patent Document 2: Japanese Laid-Open Patent Application No. 2000-1767
Patent Document 3: Japanese Laid-Open Patent Application No. 2006-265646
Patent Document 4: WO2016/002810

SUMMARY OF THE INVENTION

Problems to be Solved by the Invention

Nevertheless, in the above-described Patent Documents 1 to 3, the high wear resistance demanded in recent years has not been adequately satisfied. Further, while, in Patent Document 4, the piston ring can be preferably applied to an internal combustion engine that uses an alcohol fuel or an alcohol-containing fuel, for example, and suppress the occurrence of cracking and peeling to a greater degree than a conventional wear resistant film, there has been a demand for further improvement in characteristics under severe conditions associated with the weight saving and increased output of internal combustion engines in recent years.

The present invention is made to resolve the above-described problems, and an object of the present invention is to provide a sliding member, such as a piston ring for an internal combustion engine having low friction and excellent toughness.

Means for Solving the Problems

A sliding member according to the present invention is a sliding member comprising a sliding surface coated with a Cr—B—Ti—V—(Mn, Mo)—N-based alloy film containing one or both of Mn and Mo and having a total content of the Mn and the Mo within a range of 2 mass % or less.

The sliding member according to the present invention can be configured so that a B content is within a range of 0.1 mass % to 1.5 mass %, inclusive, a V content is within a range of 0.05 mass % to 1 mass %, inclusive, and a Ti content is within a range of 0.05 mass % to 1.5 mass %, inclusive.

The sliding member according to the present invention can be configured so that an N content is within a range of 30 mass % to 40 mass %, inclusive, and a remnant includes Cr and inevitable impurities.

In the sliding member according to the present invention, the alloy film can be configured by a first alloy film provided on a base material side and a second alloy film provided on the first alloy film.

In the sliding member according to the present invention, a hard carbon film is further provided on the alloy film.

The sliding member according to the present invention can be configured so that a nitriding treatment layer or a metal underlayer is provided as an underlayer of the alloy film.

The sliding member according to the present invention is preferably a piston ring for an internal combustion engine.

Effect of the Invention

According to the present invention, it is possible to provide a sliding member, such as a piston ring for an internal combustion engine, having low friction and excellent toughness and preferably applicable under severe conditions associated with further weight saving and increased output of internal combustion engines in recent years.

EMBODIMENTS OF THE INVENTION

Figure 1A:
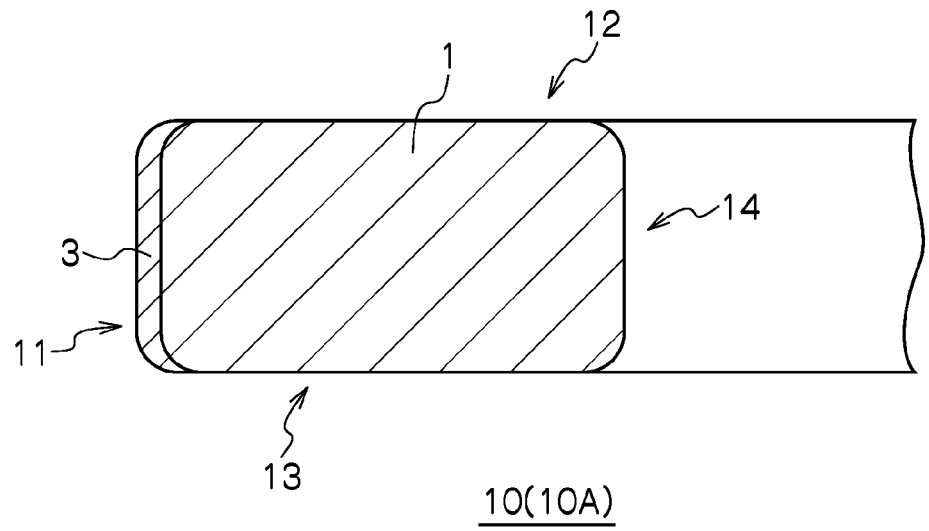
FIGS. 1A and 1B are schematic sectional views illustrating an example of a piston ring for an internal combustion engine serving as a sliding member according to the present invention.
Figure 1B:
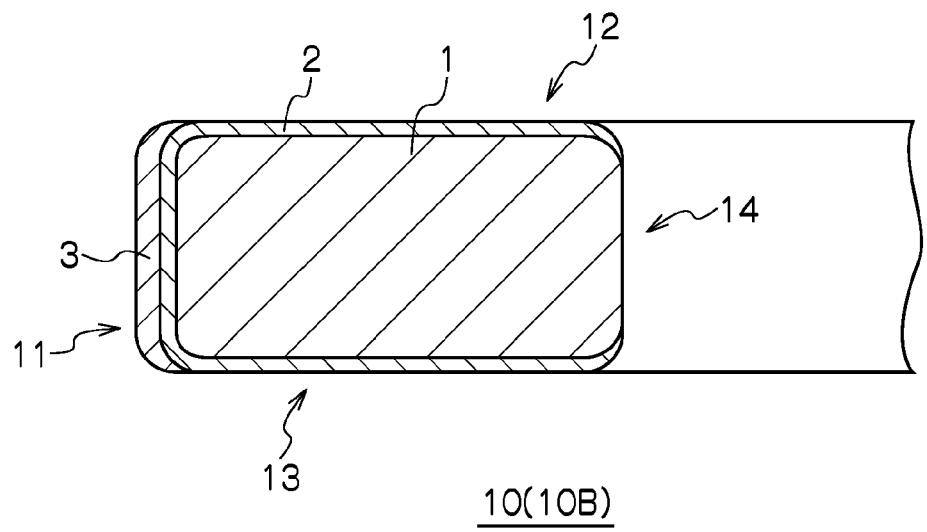

The following describes a sliding member according to the present invention with reference to the drawings. The embodiment described below is an example of the present invention, and the technical scope of the present invention is not limited to that of the embodiment. It should be noted that, in the following, descriptions are made using a piston ring for an internal combustion engine as the sliding member, and thus the sliding member is referred to as the piston ring.

The sliding member according to the present invention, as illustrated in FIGS. 1A and 1B and FIGS. 2A and 2B, is a piston ring 10 (10A, 10B) or the like coated with a Cr—B—Ti—V—(Mn, Mo)—N-based alloy film 3 on a sliding surface 11 thereof. Then, the alloy film 3 contains one or both of Mn and Mo and has a total content of the Mn and the Mo within a range of 2 mass % or less.

According to this piston ring 10, the alloy film 3 has low friction and excellent toughness, making it is possible to provide a sliding member, such as a piston ring, that can be preferably applied under severe conditions associated with further weight saving and increased output of internal combustion engines in recent years, and is unlikely to cause adhesion, cracking, or peeling. Such a piston ring 10 can be used as various piston rings, but can be preferably used as a top ring, a side rail of an oil ring, or the like, in particular.

The following describes the components of the sliding member using a piston ring for an internal combustion engine as an example.

(Base Material)

Examples of a base material 1 include various materials used as a base material of the piston ring 10 and the materials are not particularly limited. For example, various steel materials, stainless steel materials, casting materials, cast steel materials, and the like can be applied. Among these, preferable examples include a martensitic stainless steel, a chromium-manganese steel (JIS SUPS material, ISO 55Cr3 material, AISI 5155 material) which is a spring steel, a chrome-vanadium steel (JIS SUP10 material, ISO 51CrV4 material, AISI 6150 material), a silicon-chromium steel (JIS SWOSC-V material, DIN 17223/2-90), 10Cr steel, and the like. The base material 1 may also be referred to as parent material.

The base material 1 may be pretreated as necessary. Examples of the pretreatment include processing that polishes the surface to adjust the surface roughness. This adjustment of the surface roughness can be performed by, for example, methods such as lapping and polishing the surface of the base material 1 using diamond abrasive grains.

(Underlayer)

An underlayer 2 of the alloy film 3 is provided as necessary to the base material 1. Examples of the underlayer 2 include a metal underlayer (refer to FIG. 1B), a nitriding treatment layer (not illustrated), and the like. These underlayers 2 can be provided in any location in accordance with the type thereof. For example, the underlayer 2 may be formed on only the outer peripheral sliding surface 11 on which the piston ring 10 slides upon contact with a cylinder liner (not illustrated), may be formed on other surfaces, such as an upper surface 12 and a lower surface 13 of the piston ring 10, and, as necessary, may be further formed on an inner peripheral surface 14 of the piston ring 10.

When a stainless steel is applied as the base material 1, for example, the nitriding treatment layer is a hard nitrided layer formed as an underlayer by diffusing and carburizing nitrogen on the surface of the stainless steel. The nitriding treatment layer is preferably used as the underlayer of the piston ring. It should be noted that the nitriding treatment can be performed using conventionally known methods.

While not particularly limited, a thickness of the nitriding treatment layer is preferably within a range of 10 µm to 50 µm, inclusive.

Examples of the metal underlayer include a metal layer made of titanium, chromium, or the like. The under metal layer made of titanium, chromium, or the like, can be formed by various film forming means and, for example, film-forming means such as a vacuum deposition method, a sputtering method, and an ion plating method can be applied. While not particularly limited, a thickness of the metal underlayer is preferably within a range of 0.1 µm to 2 µm, inclusive.

(Alloy Film)

The alloy film 3, as illustrated in FIGS. 1A and 1B and FIGS. 2A and 2B, is provided on the base material 1, or on the underlayer 2 when the underlayer 2 is provided on the base material 1. This alloy film 3 has low friction and excellent toughness, and is preferably provided at least on the outer peripheral sliding surface 11 of the piston ring 10. The outer peripheral sliding surface 11 of the piston ring 10 comes into contact with the cylinder liner, which is an opposite material when the piston slides, and thus the alloy film 3 is provided at least on the outer peripheral sliding surface 11. With this alloy film 3 provided at least on the outer peripheral sliding surface 11, a piston ring having low friction and excellent toughness is achieved, making the occurrence of adhesion, cracking, or peeling unlikely. Furthermore, because the alloy film has excellent toughness, even when the piston ring is particularly in a high load state, a piston ring not susceptible to cracking or peeling and having excellent wear resistance, cracking resistance, and peeling resistance can be achieved. The alloy film 3 may be formed on the upper surface 12 and the lower surface 13, which are surfaces other than the outer peripheral sliding surface 11 and, as necessary, may be further formed on the inner peripheral surface 14.

The alloy film 3 is a Cr—B—V—Ti—(Mn, Mo)—N-based alloy film. The Cr—B—Ti—V—(Mn, Mo)—N-based alloy film 3 is a senary or septenary alloy film further containing one or both of the Mn and the Mo in a quinary Cr—B—V—Ti—N alloy film. Accordingly, the alloy film 3 may contain only the Mn, only the Mo, or both of the Mn and the Mo in the quinary Cr—B—V—Ti—N alloy film. It should be noted that inevitable impurities may be contained in the alloy within a range that does not inhibit the effect of this alloy film 3.

In the alloy film 3, the total content of the Mn and the Mo is within a range of 2 mass % or less. As illustrated in examples described later, the present inventors discovered that, when the alloy film 3 contains one or both of the Mn and the Mo and the total content of the Mn and the Mo is within the range of 2 mass % or less, the alloy film 3 having low friction and excellent toughness can be obtained. The Mn acts to increase the toughness and the wear resistance of the alloy film 3 and also acts to improve a friction coefficient in a fluid lubrication region from a mixed lubrication region in a Stribeck curve. The Mo acts to improve strength and hardness under high temperatures and also acts to improve a friction coefficient in a boundary lubrication region in the Stribeck curve.

Figure 3:
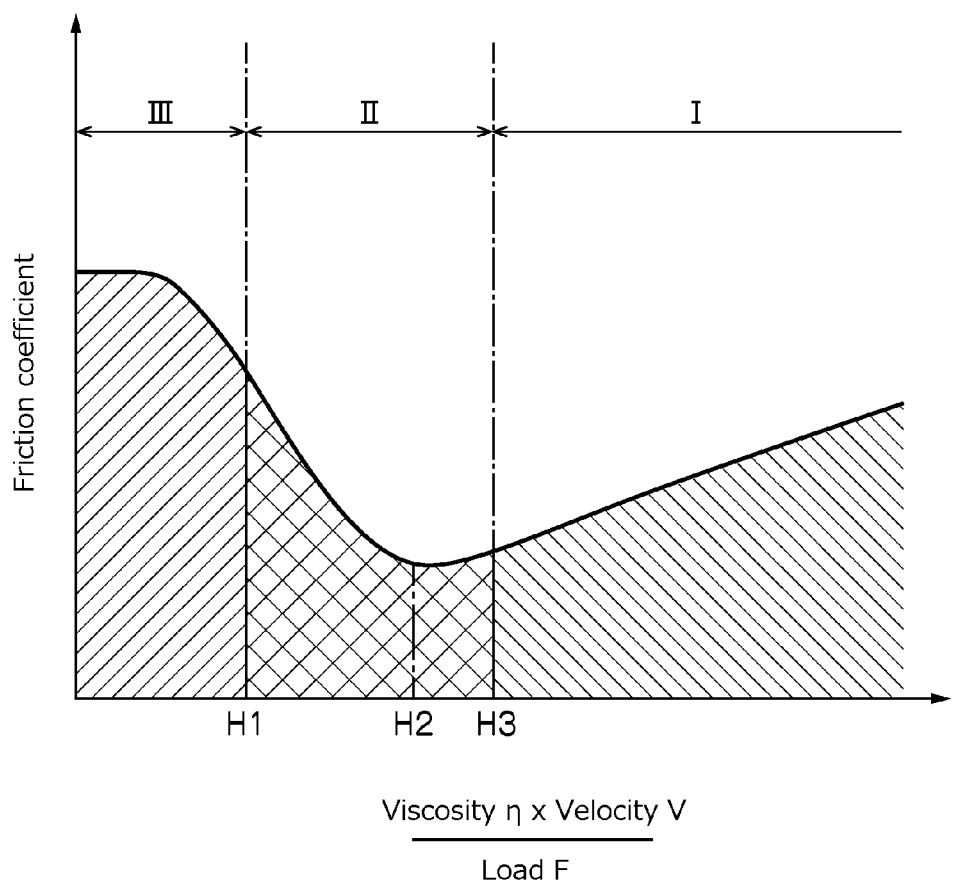
FIG. 3 is an explanatory view of a Stribeck curve.

It should be noted that the Stribeck curve is used to explain the lubrication state between two surfaces that perform relative motion, and measure the friction coefficient as a function of the relationship between a lubricating oil viscosity η, a sliding velocity V, and a load F (η×V/F), and is represented by a relationship such as shown in FIG. 3. As shown in FIG. 3, the friction state between the two surfaces can be divided into three regions. The fluid lubrication region of (I) is a region in which lubricating oil is interposed between two surfaces and completely separates and lubricates the two surfaces. The boundary lubrication region of (III) is a region in which the lubricating oil film becomes extremely thin, the friction phenomenon cannot be explained by the viscosity of the lubricating oil, and the surface chemical properties of the lubricating oil are important. The mixed lubrication region of (II) is a region in which fluid lubrication and boundary lubrication are mixed. In the fluid lubrication region of (I), there is no contact between solids in a lubrication state, and therefore basically no wear occurs, the friction coefficient is a small value, the lubricating oil viscosity decreases due to an increase in temperature, and the sliding velocity decreases, or, when the load increases, the oil film thickness of the lubricating oil interposed between the two surfaces decreases and the friction coefficient decreases. In the mixed lubrication region of (II), when the oil film thickness decreases to some extent, the fluid lubrication state reaches a limit and the surfaces partially come into contact with each other. Furthermore, when the load increases, the velocity decreases, and the lubricating oil viscosity decreases due to an increase in temperature, the oil film becomes thinner and thinner, the contact area between the surfaces widens to a greater extent than in the mixed lubrication region state of (II), the friction coefficient increases, and the friction state becomes the boundary lubrication region of (III).

When only the Mn is contained, the content of the Mn is 2 mass % or less, when only the Mo is contained, the content of the Mo is 2 mass % or less, and when both of the Mn and the Mo are contained, the total is 2 mass % or less. By setting the total content of the Mn and the Mo within this range, it is possible to make the alloy film 3 have low friction and excellent toughness. To achieve an alloy film having low friction and even greater excellent toughness, more preferably, a preferred total content of the Mn and the Mo is 2 mass % or less, and a more preferred total content is 1 mass % or less. It should be noted that, while not particularly limited, a lower limit of the total content of the Mn and the Mo may be about 0.1 mass %.

In the alloy film 3, B, V, and Ti other than the Mn and the Mo are configured so that a B content is within a range of 0.1 mass % to 1.5 mass %, inclusive, a V content is within a range of 0.05 mass % to 1 mass %, inclusive, and a Ti content is within a range of 0.05 mass % to 1.5 mass %, inclusive. The B becomes a solid solution in Cr—N, and is effective in increasing the fineness of crystals. Then, an alloy film that contains the B increases toughness and improves wear resistance. The V forms a fine nitride, and is effective in improving toughness and heat resistance. An alloy film that contains the V can increase durability in an environment having poor lubrication. The Ti forms a fine nitride and acts so as to strengthen the underlying material. An alloy film that contains the Ti further exhibits effectiveness when applied to a piston ring used in an engine that uses an alcohol fuel or an alcohol-containing fuel, for example. Possible reasons for this include that, with an ethanol fuel, for example, the alcohol and the Ti or the TiN chemically react, causing elution from the surface of the alloy film 3, and a reaction with moisture to form $TiO_2$. This $TiO_2$ then reacts with the alcohol to produce a metal alkoxide and condenses to form a polyoxy-titanium gel on the surface of the alloy film 3, thereby protecting the surface.

The more preferred range of the B content is within a range of 0.2 mass % to 1.0 mass %, inclusive, and the even more preferred range is within a range of 0.2 mass % to 0.5 mass %, inclusive. Further, the more preferred range of the V content is within a range of 0.1 mass % to 0.5 mass %, inclusive, and the more preferred range of the Ti is within a range of 0.1 mass % to 0.5 mass %, inclusive. With the B and the V contained in these preferred ranges, it is possible to exhibit even higher wear resistance. Furthermore, with the Ti contained in the preferred range, the Ti contributes to strengthening the film from the base in an alloy film and, with an alcohol fuel or an alcohol-containing fuel, forms polyoxy-titanium on the surface due to chemical changes, thereby making it possible to further increase wear resistance.

A content of an N constituting the alloy film 3 is preferably within a range of 30 mass % to 40 mass %, inclusive.

The composition of the alloy film 3 was determined by elemental analysis using a glow discharge optical emission spectrometer (glow discharge optical emission spectrometry; GD-OES method). This GD-OES method is a technique for measuring element distribution of a thin film in a depth direction by subjecting a conductive or non-conductive film to high-frequency sputtering in an Ar glow discharge region, and continuously separating a light emission line of the sputtered atoms in the Ar plasma. In examples described later, a Marcus-type radio-frequency glow discharge optical emission surface spectrometer (rf-GD-OES) manufactured by Horiba, Ltd. was used. The measurement at that time was performed by normal-sputtering (in an argon atmosphere), setting the measurement range to 4 mm in diameter, cutting out a sample to 7-mm square and then encapsulating (embedding) the sample in indium, and analyzing a depth by the GD-OES method.

The alloy film 3 is normally formed at least on the outer peripheral sliding surface 11 of the piston ring 10 by a physical vapor deposition (PVD) method. Examples of the PVD method include an ion plating method, a vacuum deposition method, a sputtering method, and the like.

Figure 2A:
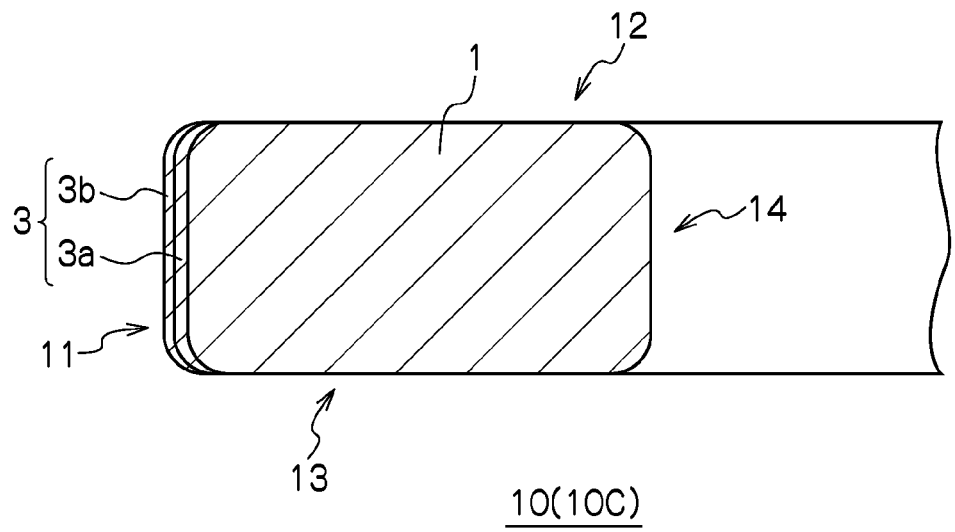
FIGS. 2A and 2B are schematic sectional views illustrating another example of a piston ring for an internal combustion engine serving as the sliding member according to the present invention.

As illustrated in FIG. 2A, the alloy film 3 thus formed can be configured by a first alloy film (also referred to as an intermediate film) 3a provided on the base material side, and a second alloy film (also referred to as a dense film) 3b provided on the first alloy film. In addition, the intermediate film 3a on the base material side of the piston ring is preferably more porous than the dense film 3b on the front surface side (sliding surface side). This intermediate film 3a is advantageous in that the film acts so as to alleviate a stress between the alloy film 3 on the front surface side and the base material or the underlayer, making it possible to improve an adhesive force and thus suppress cracking and peeling of the dense film 3b. The composition of the porous intermediate film 3a on the base material side is the same as the composition of the dense film 3b on the front surface side, and the intermediate film 3a can be formed by adjusting film forming conditions. Such an intermediate film 3a may have a uniform composition in a thickness direction, or a composition that changes in the thickness direction, and the thickness, while not particularly limited, is within a range of 0.01 μm to 20 μm, inclusive, for example, and preferably around 5 μm (3 μm to 8 μm, inclusive).

The relationship between the intermediate film 3a, the dense film 3b, and the base material 1 exhibiting the actions described above can be expressed so as to satisfy the Young's modulus relational expression below. By satisfying this relationship, it is possible to disperse the stress concentrated at an interface between the alloy film 3 and the base material 1 throughout the film, and achieve a film having excellent toughness.

[Young's modulus of dense film+Young's modulus of base material]/[2×1.08]≤[Young's modulus of intermediate film]≤[Young's modulus of dense film+Young's modulus of base material]/[2× 0.92]

It should be noted that the porous intermediate film 3a on the base material side and the dense film 3b on the front surface side can be easily analyzed by image analysis using a cross-section polisher (CP). These make it possible to change and control a bias voltage and a nitrogen gas pressure, for example. While not particularly limited, each of these can be formed by maintaining the nitrogen gas pressure inside the chamber at 6 Pa and setting the bias voltage to 0 V to −7 V when forming the porous intermediate film 3a, and setting the nitrogen gas pressure to 4.5 Pa and the bias voltage to −7 V to −30 V when forming the dense film 3b, for example.

While not particularly limited, a thickness of the formed alloy film 3 is preferably within a range of 3 μm to 50 μm, inclusive, and more preferably within a range of 10 μm to 35 μm, inclusive. A hardness of the dense film 3b on the front surface side of the alloy film 3 is preferably within a range of 1400 to 2000, inclusive, and more preferably within a range of 1600 to 1800, inclusive, at Vickers hardness (JIS B 7725, ISO 6507) HV (0.05). Further, a hardness of the intermediate film 3a on the base material side of the alloy film 3 is preferably within a range of 800 to 1600, inclusive, and more preferably within a range of 1200 to 1500, inclusive, at HV (0.05). Vickers hardness can be measured using a micro Vickers hardness tester (manufactured by Future-Tech Corp.) or the like, and "HV (0.05)" indicates the Vickers hardness at a load of 50 gf (Other)

Figure 2B:
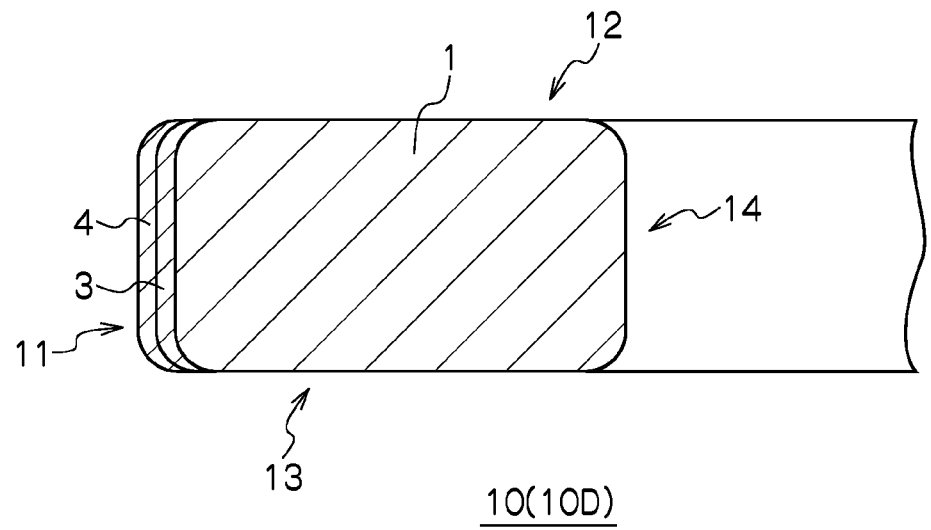

Another film may be provided on the alloy film 3 as necessary. Examples of such a film include a hydrogen-free diamond-like carbon (hard carbon film 4) and the like, such as illustrated in FIG. 2B. Such a hard carbon film 4 is preferable in that the film can improve a running-in property to an opposite material.

(Applied Fuel)

The piston ring 10 according to the present invention exhibits high wear resistance, and thus can be preferably mounted not only on an engine that uses a normal gasoline fuel, but also on an engine that uses an alcohol fuel or an alcohol-containing fuel. While, under severe conditions such as a further increase in the cylinder internal pressure inside the engine in a flexible-fuel vehicle that uses an alcohol fuel or an alcohol-containing fuel, a piston ring with a conventional wear resistant film formed thereon is susceptible to the burning, and the cracking and the peeling of the wear resistant film caused by insufficient toughness, the piston ring 10 according to the present invention can be preferably applied to not only an internal combustion engine that uses normal gasoline fuel, but also an internal combustion engine that uses an alcohol fuel or an alcohol-containing fuel, or the like, for example, has lower friction and greater excellence in toughness than a conventional wear resistant film, and exhibits the effect of making it possible to suppress the occurrence of cracking and peeling.

EXAMPLES

The following describes the sliding member according to the present invention in further detail using examples, comparative examples, and a conventional example of a piston ring.

Examples 1 to 13 and Comparative Examples 1 to 10

A piston ring base material equivalent to a SUJ2 material as defined in JIS standards, composed of C: 1.00 mass %, Si: 0.25 mass %, Mn: 0.3 mass %, Cr: 1.5 mass %, P: 0.02 mass %, S: 0.02 mass %, and a remnant of iron and inevitable impurities, was used as the base material 1. The base material 1 was ultrasonically cleaned in an organic solvent in advance.

Next, the alloy film was formed on the base material 1. The film was formed by generating an arc discharge on the surface using an arc ion plating device and a target in which the composition was adjusted to make the alloy film composition expected after film formation. Further, nitrogen gas and, as necessary, a predetermined amount of inert gas (here, an argon gas) were introduced into the chamber that performed arc discharge, and a bias voltage of 0 to −30 V was applied to form the alloy films 3 in Examples 1 to 13 and Comparative Examples 1 to 10 to have a thickness of 20 μm. The alloy films 3 obtained here were configured by the porous intermediate film 3a on the base material side and the dense film 3b on the front surface side, and the film was formed by maintaining the nitrogen gas pressure inside the chamber at 6 Pa and setting the porous intermediate film 3a on the base material side to a bias voltage of 0 V and a thickness of 5 μm, and setting the dense film 3b on the front surface side to a nitrogen gas pressure of 4.5 Pa, an average bias voltage of −16 V, and a thickness of 20 μm. The compositions shown in Table 1 are the compositions of the dense film 3b of the alloy film 3. It should be noted that, although not shown in Table 1, the composition of the intermediate film 3a matches or substantially matches the composition of the dense film 3b, and therefore is omitted.

TABLE 1

| | Composition of alloy film (dense film) (mass %) | | | | | | |
|---|---|---|---|---|---|---|---|
| | B | N | Ti | V | Cr | Mn | Mo |
| Comparative Example 1 | — | 35.52 | — | — | 64.48 | — | — |
| Comparative Example 2 | 0.70 | 35.29 | — | — | 64.01 | — | — |
| Comparative Example 3 | 0.36 | 35.55 | 2.41 | 0.36 | 61.32 | — | — |
| Comparative Example 4 | 0.35 | 36.27 | — | — | 62.93 | 0.45 | — |
| Comparative Example 5 | 0.35 | 35.48 | — | — | 63.15 | 0.88 | — |
| Comparative Example 6 | 0.35 | 35.55 | — | — | 63.17 | — | 0.51 |
| Comparative Example 7 | 0.35 | 35.41 | — | — | 63.19 | — | 0.98 |
| Example 1 | 0.35 | 36.17 | 0.48 | 0.35 | 62.39 | 0.43 | 0.45 |
| Example 2 | 0.36 | 35.68 | 0.48 | 0.34 | 62.99 | 0.42 | — |
| Example 3 | 0.35 | 36.29 | 0.47 | 0.35 | 62.21 | — | 0.45 |
| Example 4 | 0.35 | 36.29 | 0.25 | 0.14 | 63.23 | 0.17 | 0.18 |
| Example 5 | 0.36 | 35.62 | 0.25 | 0.14 | 62.78 | 0.18 | — |
| Example 6 | 0.36 | 35.66 | 0.25 | 0.14 | 62.74 | — | 0.22 |
| Example 7 | 0.35 | 36.02 | 0.25 | 0.14 | 62.76 | 0.88 | — |
| Example 8 | 0.35 | 35.52 | 0.25 | 0.15 | 62.03 | 1.89 | — |
| Example 9 | 0.36 | 35.68 | 0.24 | 0.14 | 61.30 | — | 0.85 |
| Example 10 | 0.36 | 35.55 | 0.25 | 0.15 | 61.81 | — | 1.92 |
| Example 11 | 0.35 | 35.48 | 0.24 | 0.14 | 63.43 | 0.91 | 0.87 |
| Example 12 | 0.39 | 34.84 | 0.18 | 0.10 | 63.57 | 0.18 | 0.17 |
| Example 13 | 0.31 | 36.3 | 0.18 | 0.10 | 59.33 | 0.18 | 0.18 |
| Comparative Example 8 | 0.36 | 35.52 | 0.5 | 0.36 | 63.15 | 1.87 | 2.74 |
| Comparative Example 9 | 0.35 | 35.52 | 0.46 | 0.36 | 60.40 | 2.13 | — |
| Comparative Example 10 | 0.36 | 36.41 | 0.48 | 0.37 | 60.16 | — | 2.22 |

*A dash (—) in the table means that the element is not included.

Examples 1' to 13' and Comparative Examples 3' to 10'

In the Examples 1 to 13 and Comparative Examples 3 to 10 described above, the alloy film 3 was configured only by the dense film 3b having a thickness of 20 μm without formation of the intermediate film 3a. Otherwise, the configurations were the same.

Characteristic Evaluation

Various tests described later were performed on characteristics, and the results are shown in Table 2. Table 2 shows "composition of alloy film (mass %)," "wear ratio" given 1 as the wear amount of Comparative Example 1, "film hardness (Vickers hardness)," "hardness ratio" to the film hardness of Comparative Example 1, "scratch ratio," and "toughness evaluation value" obtained by multiplying the hardness ratio and the scratch ratio. It should be noted that a wear ratio value less than 1 indicates a higher wear resistance than that in Comparative Example 1.

TABLE 2

| | Wear ratio | Film hardness HV | Hardness ratio | Scratch ratio Intermediate film + Dense film | Toughness evaluation value | Cracking and peeling occurrence time (minutes) |
|---|---|---|---|---|---|---|
| Comparative Example 1 | 1.00 | 1400 | 1.00 | 1.00 | 1.00 | 30 |
| Comparative Example 2 | 0.44 | 1800 | 1.29 | 0.65 | 0.84 | 60 |
| Comparative Example 3 | 0.32 | 1600 | 1.14 | 1.01 | 1.15 | 140 |
| Comparative Example 4 | 0.35 | 1600 | 1.14 | 1.10 | 1.26 | 160 |
| Comparative Example 5 | 0.34 | 1650 | 1.18 | 1.07 | 1.26 | 170 |
| Comparative Example 6 | 0.36 | 1650 | 1.18 | 1.07 | 1.26 | 200 |
| Comparative Example 7 | 0.35 | 1700 | 1.21 | 1.04 | 1.41 | 220 |
| Example 1 | 0.38 | 1800 | 1.29 | 1.10 | 1.41 | 620 |
| Example 2 | 0.36 | 1800 | 1.29 | 1.10 | 1.40 | 580 |
| Example 3 | 0.36 | 1800 | 1.29 | 1.09 | 1.56 | 580 |
| Example 4 | 0.31 | 1750 | 1.25 | 1.25 | 1.59 | 1140 |
| Example 5 | 0.30 | 1750 | 1.25 | 1.27 | 1.56 | 870 |
| Example 6 | 0.32 | 1750 | 1.25 | 1.25 | 1.38 | 930 |
| Example 7 | 0.34 | 1750 | 1.25 | 1.10 | 1.41 | 730 |
| Example 8 | 0.35 | 1800 | 1.29 | 1.09 | 1.39 | 700 |
| Example 9 | 0.33 | 1750 | 1.25 | 1.11 | 1.42 | 780 |
| Example 10 | 0.35 | 1800 | 1.29 | 1.10 | 1.43 | 590 |
| Example 11 | 0.35 | 1800 | 1.29 | 1.11 | 1.54 | 990 |
| Example 12 | 0.32 | 1750 | 1.25 | 1.23 | 1.54 | 990 |
| Example 13 | 0.33 | 1750 | 1.25 | 1.23 | 1.25 | 1000 |
| Comparative Example 8 | 0.43 | 1850 | 1.32 | 1.01 | 1.33 | 460 |

TABLE 2-continued

| | Wear ratio | Film hardness HV | Hardness ratio | Scratch ratio Intermediate film + Dense film | Toughness evaluation value | Cracking and peeling occurrence time (minutes) |
|---|---|---|---|---|---|---|
| Comparative Example 9 | 0.40 | 1850 | 1.32 | 1.03 | 1.36 | 520 |
| Comparative Example 10 | 0.40 | 1850 | 1.32 | 1.00 | 1.32 | 580 |

(Wear Test)

Figure 5:
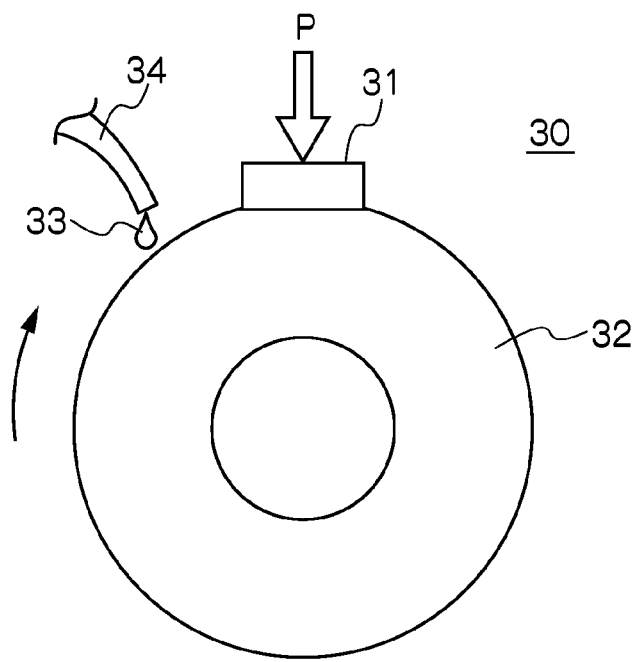
FIG. 5 is an explanatory view of an Amsler wear test method.

The wear ratios shown in Table 2 were measured by using an Amsler wear tester 30 illustrated in FIG. 5, measurement samples 31 (length: 7 mm, width: 8 mm, height: 5 mm) obtained under the same conditions as those of the piston rings obtained in Examples 1 to 13 and Comparative Examples 1 to 10 described above as stationary pieces, and a doughnut-shaped (outer diameter: 40 mm, inner diameter: 16 mm, thickness: 10 mm) object as an opposite material 32 (rotating piece), causing the measurement sample 31 and the opposite material 32 to come into contact, and then applying a load P. A friction coefficient test was conducted using each of the measurement samples 31 under conditions including a lubricating oil 33: machine oil (kinematic viscosity: 1.01 at 100° C., and 2.2 at 40° C.), oil temperature: room temperature, rotation speed: 200 rpm, load: 588 N, test period: 3 hours, and boron cast iron as the opposite material 32. The oil dripping velocity from a dripping tube 34 was 0.04 mL/min. It should be noted that the opposite material 32 composed of boron cast iron was first ground into a predetermined shape and then sequentially surface-ground while changing the fineness of the grinding stone, making adjustments so as to achieve, at an arithmetic average roughness Ra, a final roughness of 0.02 to 0.04 μmRz (compliant with JIS B0601 (2001)).

The test results are shown in Table 2 as wear ratios. The wear ratios are each expressed as a ratio given 1 as the wear amount in Comparative Example 1. The alloy films (Examples 1 to 13) within the composition ranges according to the present invention all exhibited wear ratios of less than 1 and high wear resistance, in the more preferred Examples 4 to 6, the wear ratios were within the range of 0.30 to 0.32.

(Scratch Test)

Figure 4:
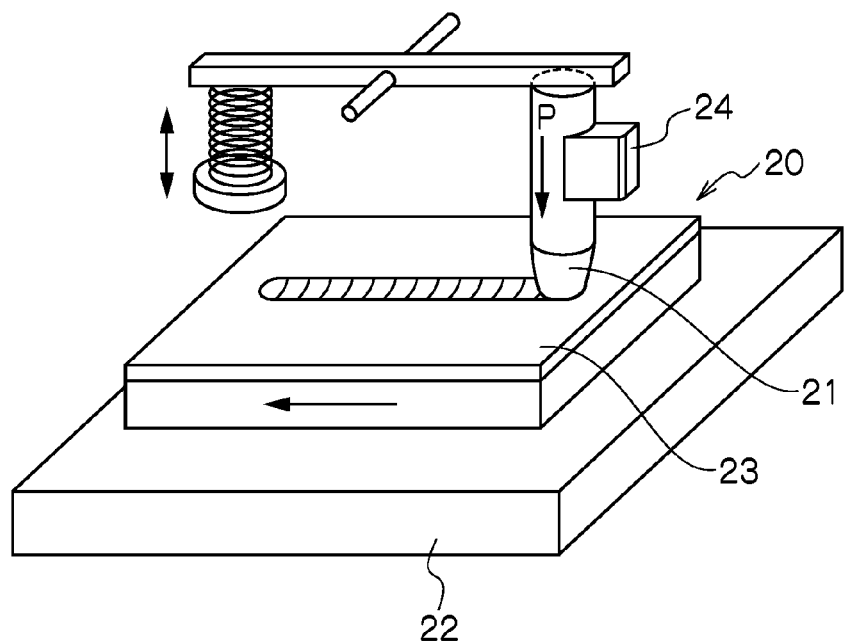
FIG. 4 is an explanatory view of a tribometer used to measure the Stribeck curve.

In the scratch test, the critical load at which film peeling occurs was determined, and the scratch ratio (peeling resistance ratio) representing peeling resistance was evaluated. The scratch test is a test method for a force applied in parallel (horizontal) to the sliding surface on which the film is formed, and was carried out using a scratch testing device 20 (manufactured by Anton Paar GmbH, model name: Revetest Scratch Tester RST3) illustrated in FIG. 4. The scratch testing device 20 illustrated in FIG. 4 is a device for detecting acoustic emission (AE) generation using an AE detector 24 while pressing an indenter 21 from above a sample 23 (13 mm×13 mm×5 mm in thickness) placed on a table 22 and moving the sample 23 in that state. Here, measurements were carried out under the conditions of loading rate: 100 N/min, table velocity: 10 mm/min, AE sensitivity: 1.2, indenter tip: R 0.2 mm, test load: 0 to 100 N, test distance: 5 mm, and test piece material: SKH51. In the evaluation, the load when AE generation was detected by the scratch test was defined as a peeling load (scratch load).

The scratch ratio (peeling resistance ratio) represents the scratch load of Examples 1 to 13 and Comparative Examples 2 to 10 as a relative ratio to the scratch load of Comparative Example 1, and the results are shown in Table 2. Furthermore, the scratch ratio represents the scratch load of Examples 1' to 13' and Comparative Examples 3' to 10' as a relative ratio to the scratch load of Comparative Example 1, and the results are shown in Table 3. The greater the scratch ratio is than 1, the larger the scratch load and the higher the peeling resistance. As shown in Table 2 and Table 3, the peeling resistances of Examples 1 to 13 and Examples 1' to 13' are excellent, and the peeling resistances of Examples 4 to 6, 12, and 13 as well as Examples 4' to 6', 12', and 13' are particularly excellent. When the alloy film 3 composed of the intermediate film 3a and the dense film 3b is compared with the alloy film 3 composed of the dense film 3b alone, the former (the alloy film 3 composed of the intermediate film 3a and the dense film 3b) has a higher scratch ratio. As a result, it is found that providing the intermediate film 3a as a lower layer of the dense film 3b increases peeling resistance.

TABLE 3

| | Scratch ratio Dense film only |
|---|---|
| Comparative Example 3' | 0.95 |
| Comparative Example 4' | 1.04 |
| Comparative Example 5' | 1.01 |
| Comparative Example 6' | 1.01 |
| Comparative Example 7' | 0.98 |
| Example 1' | 1.04 |
| Example 2' | 1.04 |
| Example 3' | 1.03 |
| Example 4' | 1.18 |
| Example 5' | 1.20 |
| Example 6' | 1.18 |
| Example 7' | 1.04 |
| Example 8' | 1.03 |
| Example 9' | 1.05 |
| Example 10' | 1.04 |
| Example 11' | 1.05 |
| Example 12' | 1.16 |
| Example 13' | 1.16 |
| Comparative Example 8' | 0.95 |
| Comparative Example 9' | 0.97 |
| Comparative Example 10' | 0.94 |

(Friction Evaluation)

Figure 6:
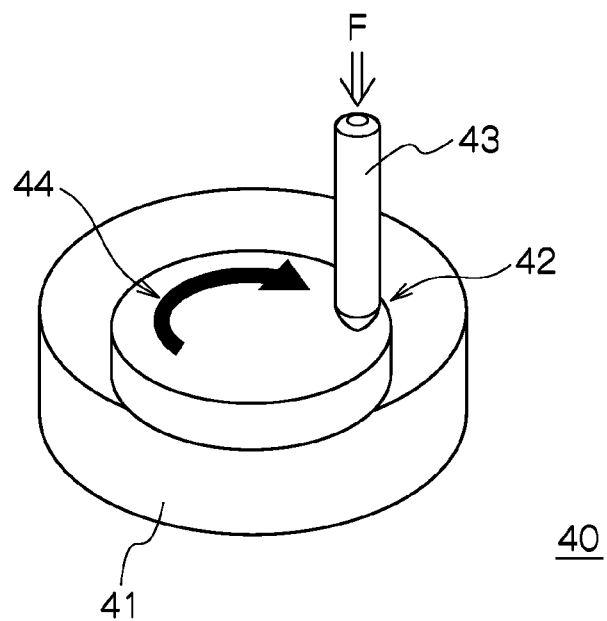
FIG. 6 is a configuration principle view of a scratch tester used for evaluating toughness.
Figure 7:
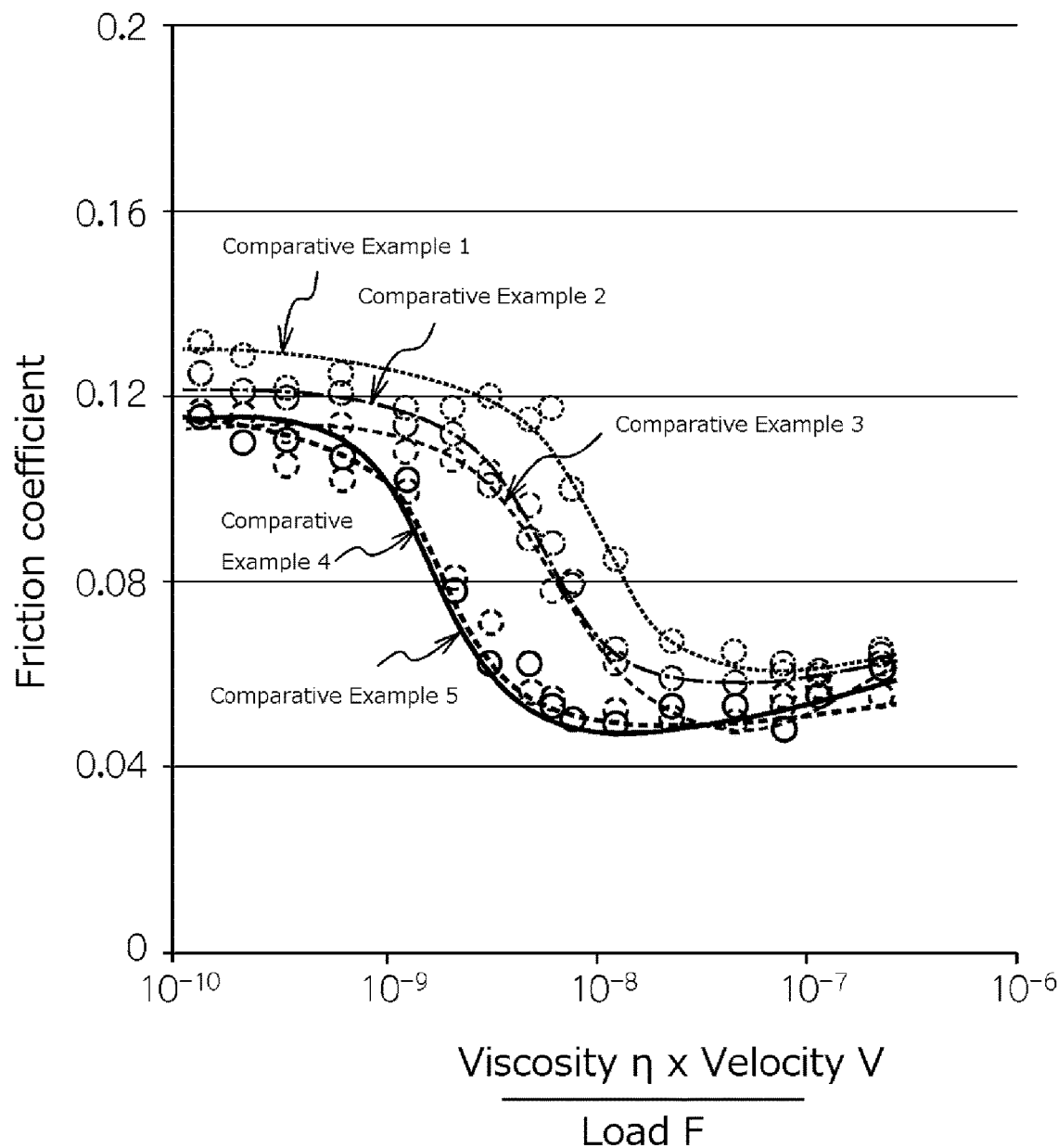
FIG. 7 shows Stribeck curves of Comparative Examples 1 to 5.
Figure 8:
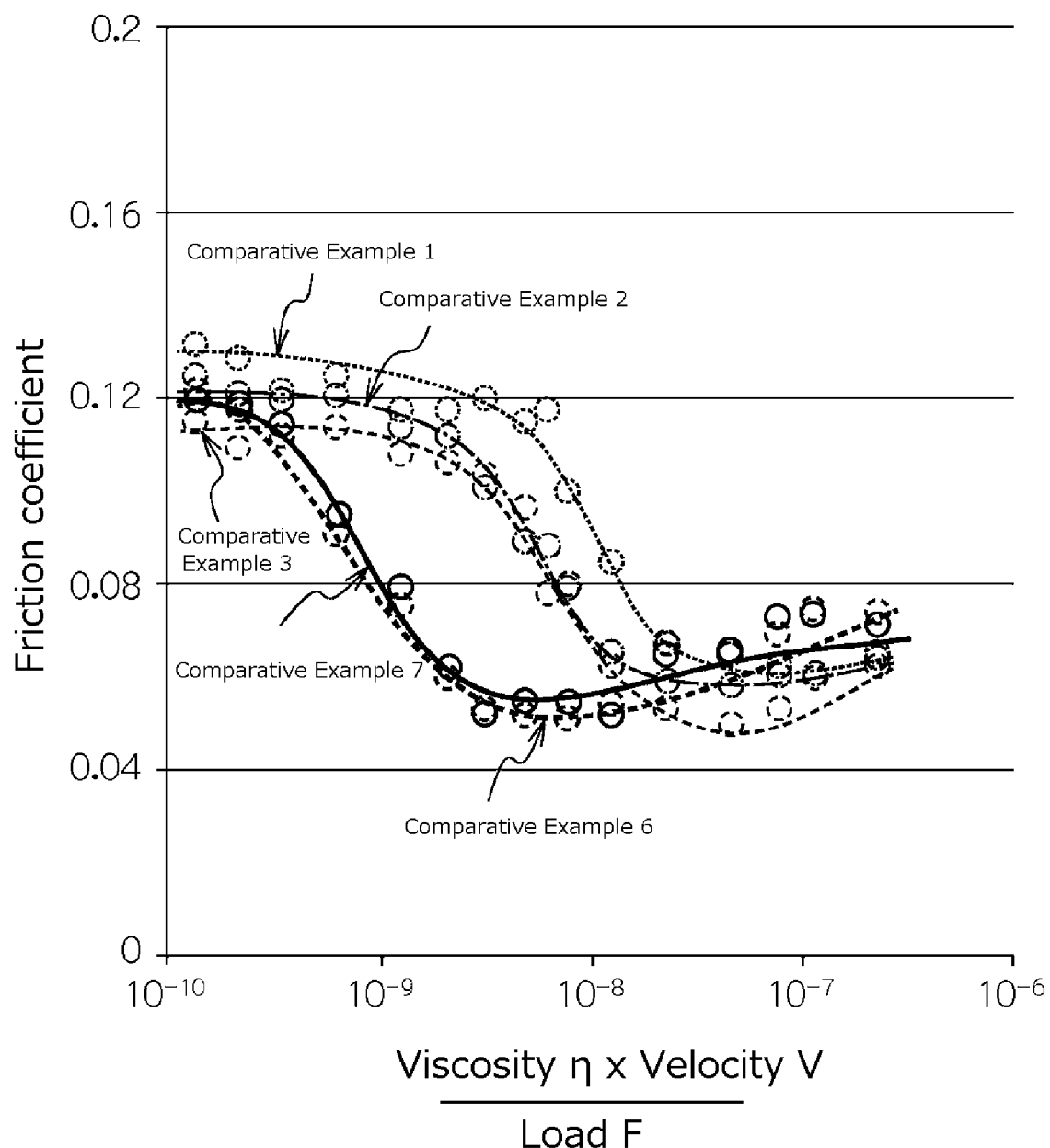
FIG. 8 is a comparison between Stribeck curves of Comparative Examples 6 and 7 and the Stribeck curves of Comparative Examples 1 to 3.
Figure 9:
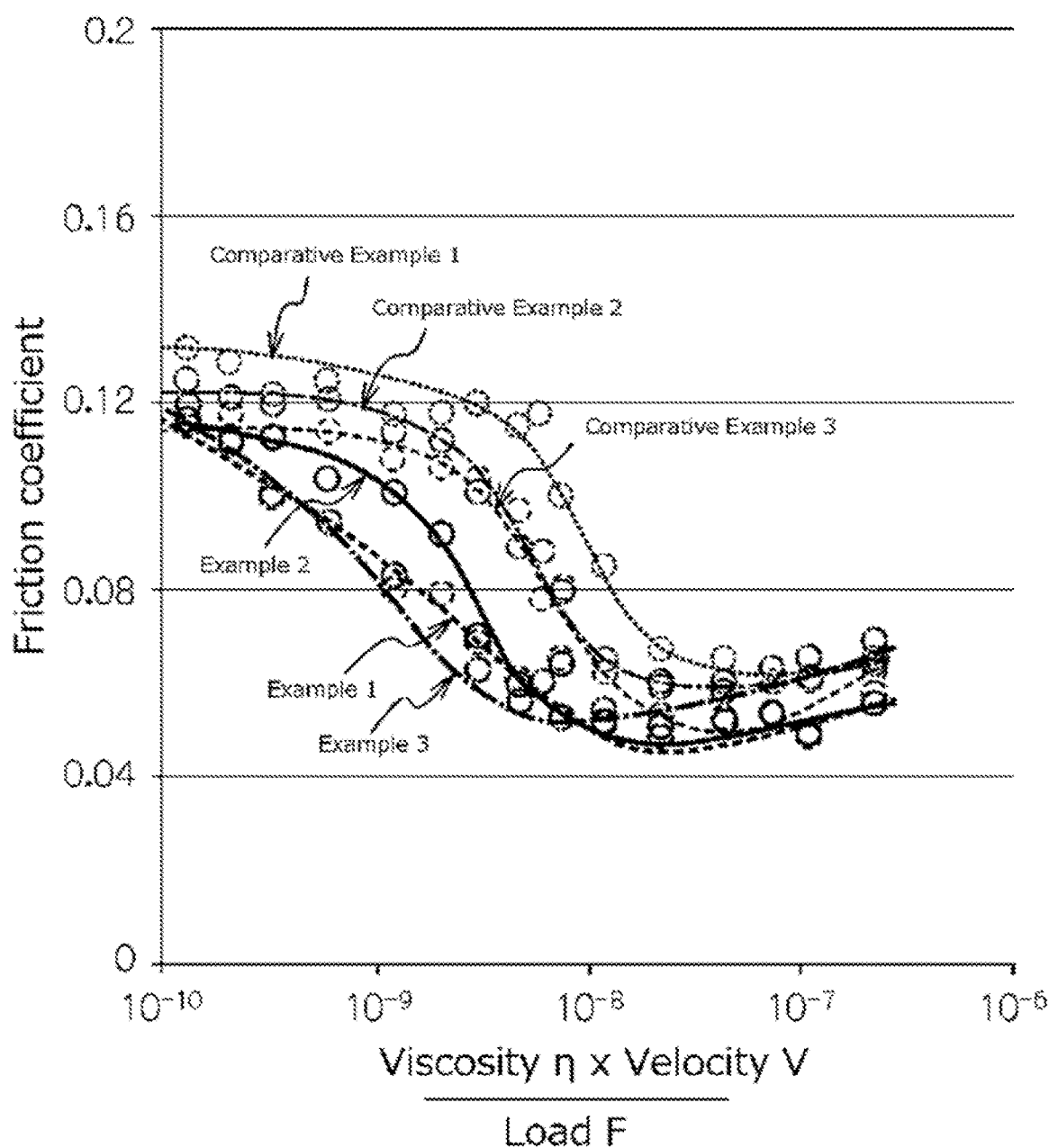
FIG. 9 is a comparison between Stribeck curves of Examples 1 to 3 and the Stribeck curves of Comparative Examples 1 to 3.
Figure 10:
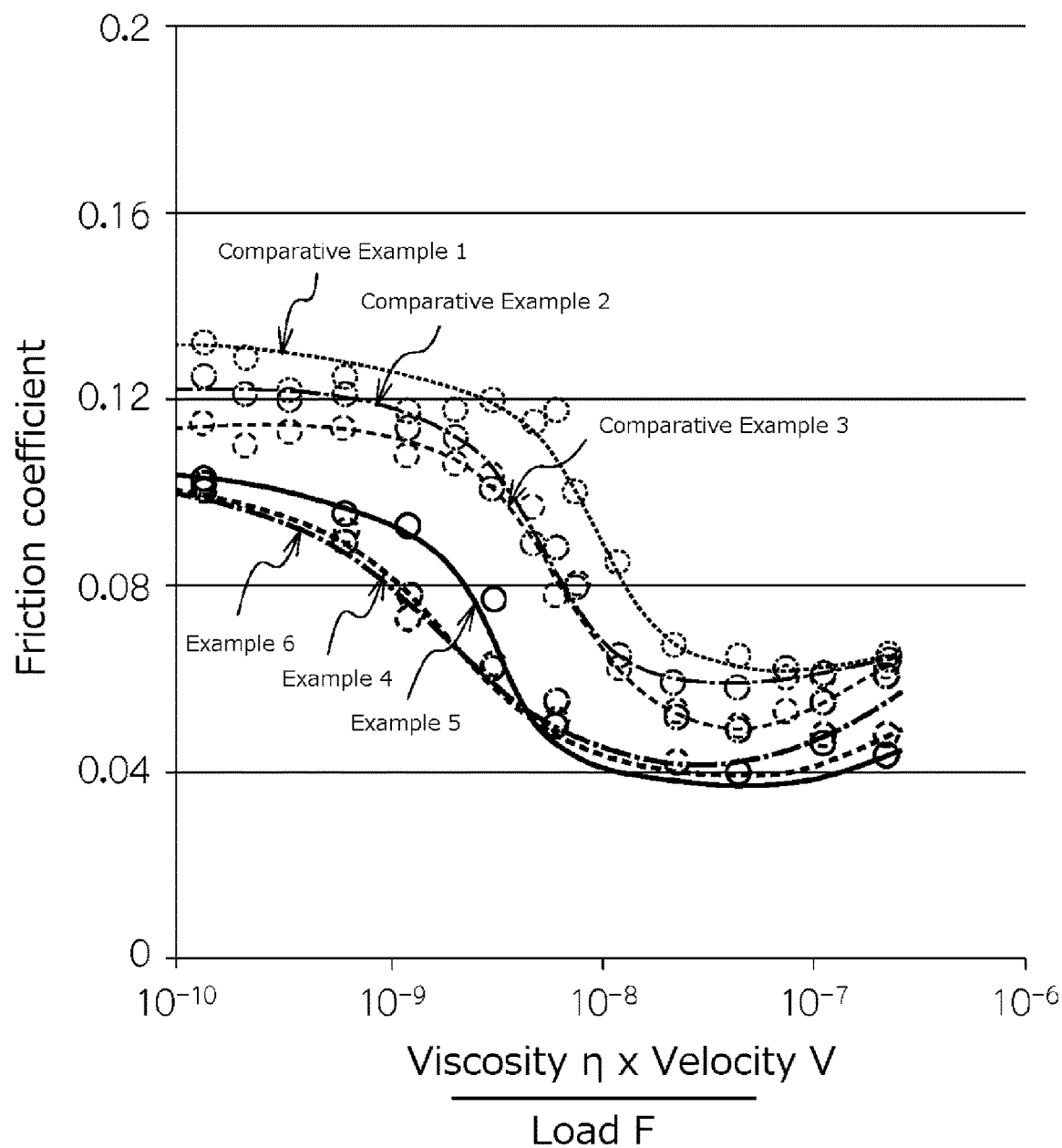
FIG. 10 is a comparison between Stribeck curves of Examples 4 to 6 and the Stribeck curves of Comparative Examples 1 to 3.
Figure 11:
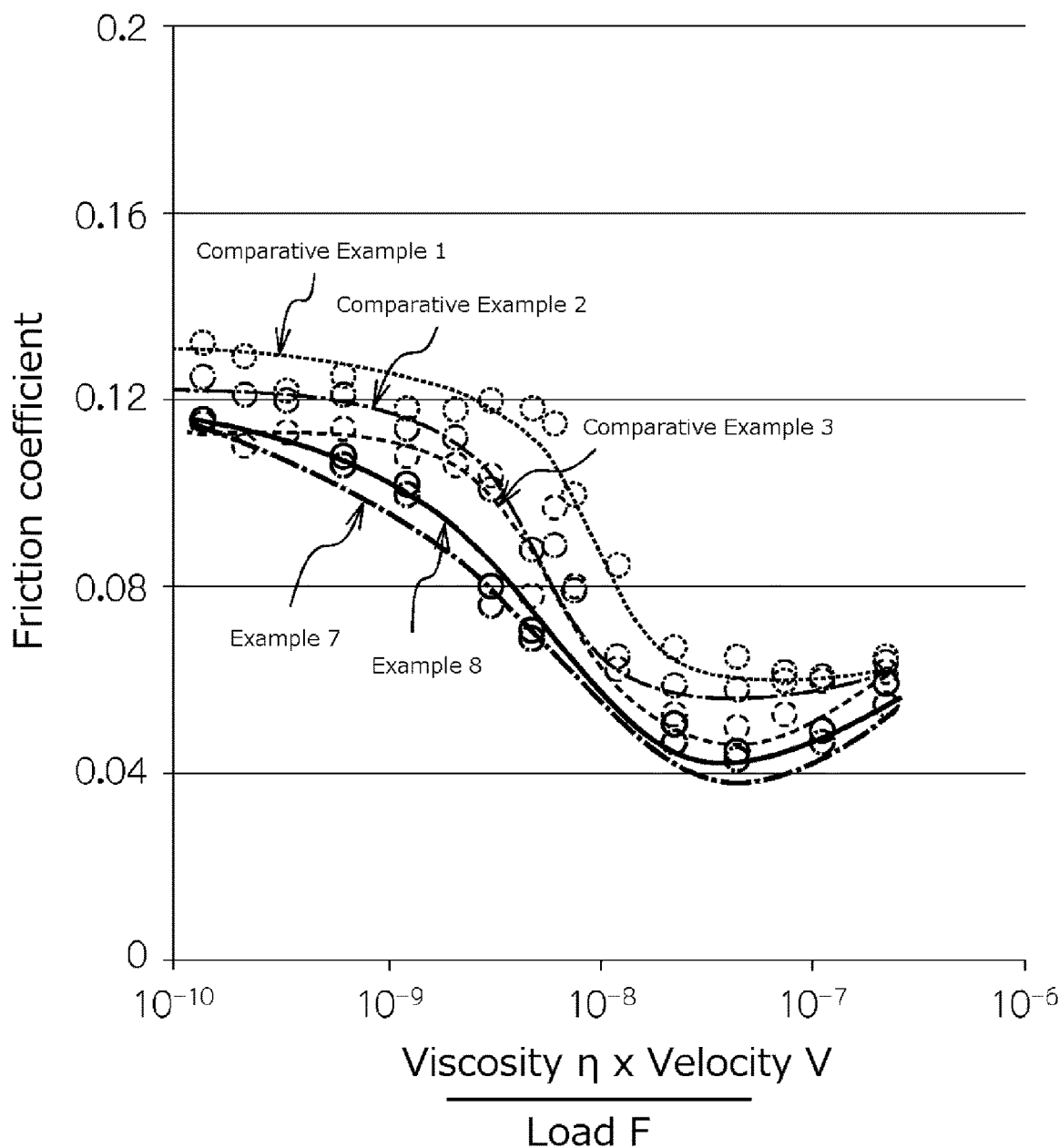
FIG. 11 is a comparison between Stribeck curves of Examples 7 and 8 and the Stribeck curves of Comparative Examples 1 to 3.
Figure 12:
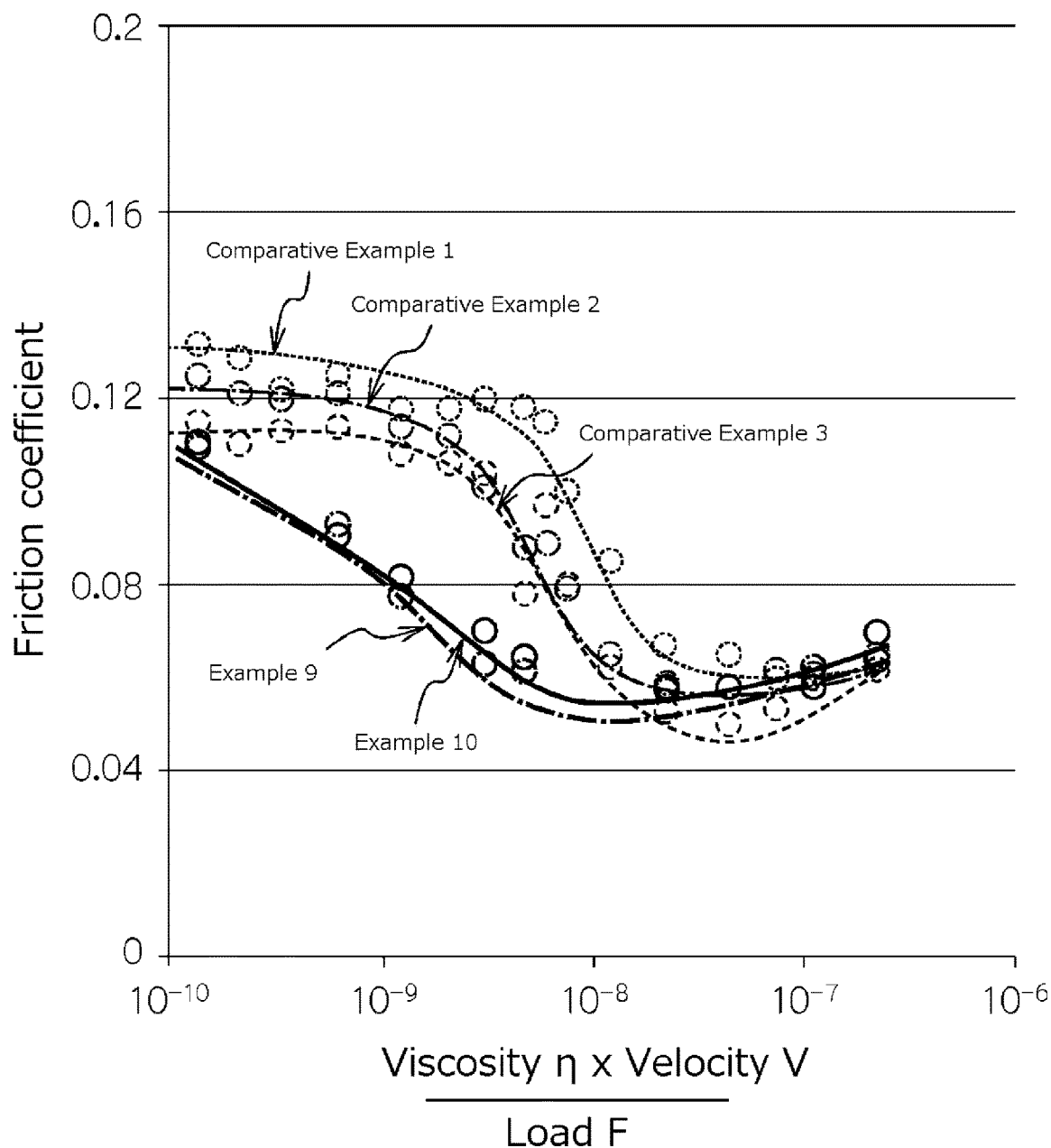
FIG. 12 is a comparison between Stribeck curves of Examples 9 and 10 and the Stribeck curves of Comparative Examples 1 to 3.
Figure 13:
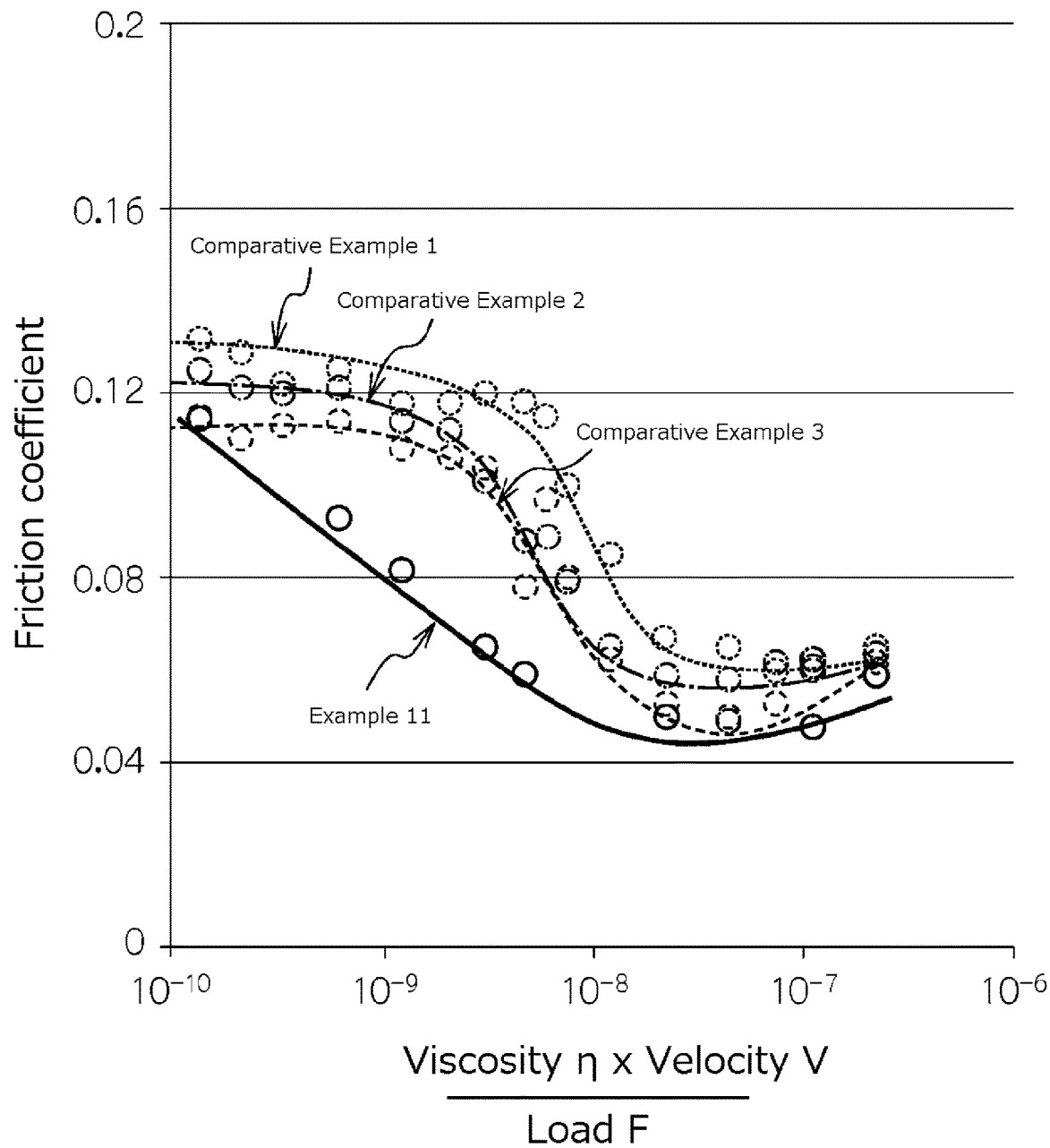
FIG. 13 is a comparison between a Stribeck curve of Example 11 and the Stribeck curves of Comparative Examples 1 to 3.
Figure 14:
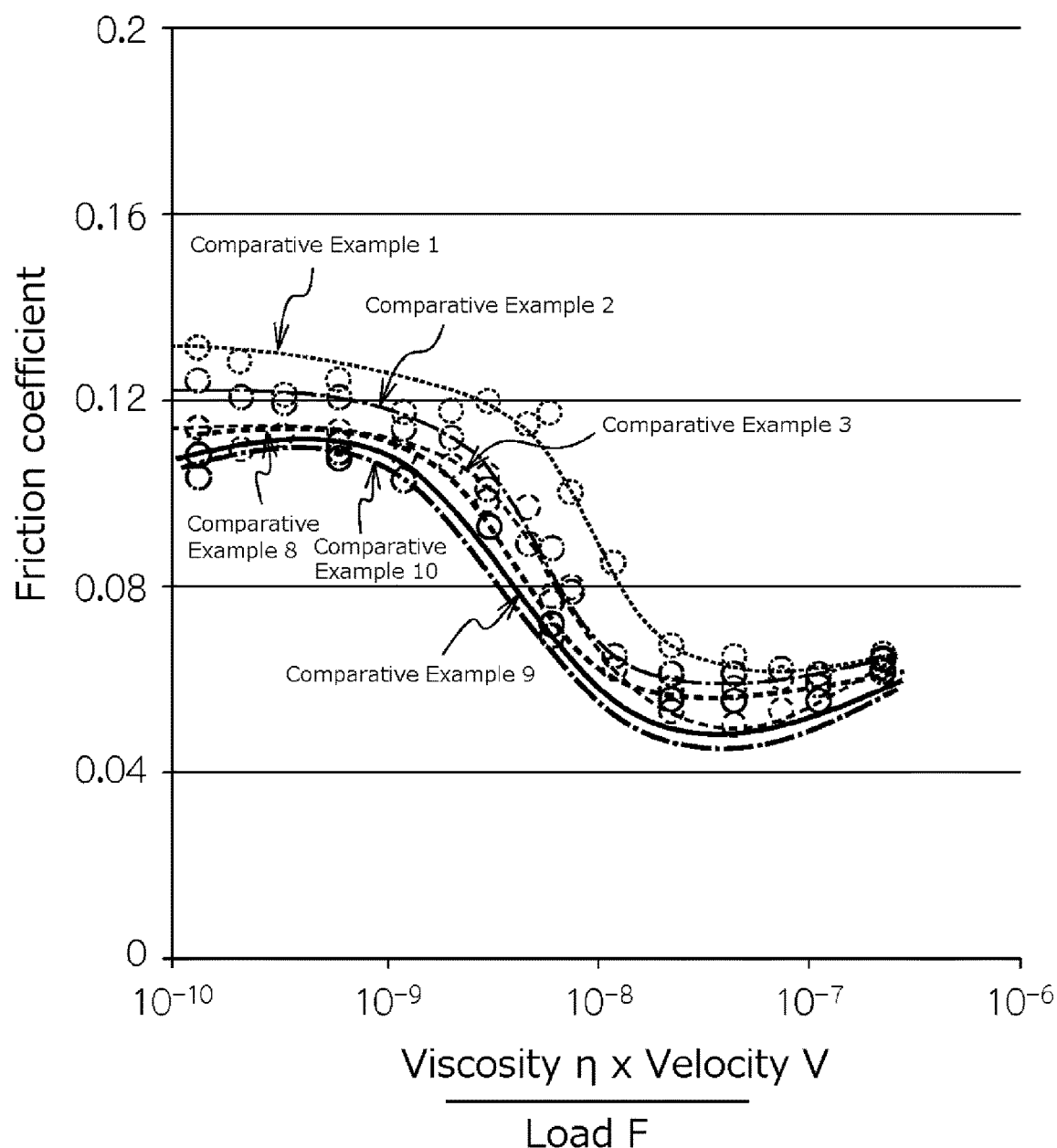
FIG. 14 is a comparison between Stribeck curves of Comparative Examples 8 to 10 and the Stribeck curves of Comparative Examples 1 to 3.

Friction was evaluated using a ball-on-disk friction and wear tester (Tribometer, model number: TRB-S-AU-0000) manufactured by Anton Paar GmbH. A ball-on-disk friction and wear tester 40 is a device for performing a test using a disk and a ball and, with a rotating disk 41 and a fixed ball 42 arranged as illustrated in FIG. 6, applies a load F by a spindle 43 from above the ball 42 onto a test sample 44. In this state, a frictional force generated by the rotation of the disk 41 is measured by a sensor, and the friction coefficient is calculated by dividing the frictional force by the applied load. The test conditions were linear velocity: 1 to 10 cm/sec, test load: 1 to 10 N, test piece material: SUJ2, lubrication: in oil, and oil type: Super Mulpus DX2 and DX46 manufactured by JXTG Nippon Oil & Energy Corporation.

The above-described load was changed and the friction coefficient at that time was measured. FIG. 7 to FIG. 14 show the Stribeck curves of Examples 1 to 13 and Comparative Examples 1 to 10. It should be noted that the Stribeck curve is used to explain the lubrication state between two surfaces that perform relative motion, and represent the result of the friction coefficient as a function of [Viscosity η×Velocity V/Load F). From these Stribeck curves, the following is found.

From the results of the Stribeck curves shown in FIG. 7 to FIG. 14, it is found that the formation of the alloy film constituting the sliding member according to the present invention significantly decreases the friction coefficient in the boundary lubrication region (III). The boundary lubrication region (III) is the region where adhesion is most likely to occur, and therefore the low friction coefficient in that region means that adhesion is unlikely to occur, adhesive wear is reduced, and shearing stress due to adhesion that occurs on the film surface is reduced. By this effect, it is possible not only to reduce the friction coefficient during operation of the engine, but also to suppress the cracking and the peeling that occur under an alcohol fuel environment as illustrated in FIG. 15 described later.

Further, the scratch ratio tended to decrease as hardness increased, but this is presumably because the film became brittle and thus susceptible to brittle fracture. Harder is sweepingly not better, but wear due to sliding and damage to the film surface tend to improve with a higher hardness, and thus it can be said that toughness is high when hardness is high and the scratch load is high. In Table 2, a toughness evaluation value is expressed as the product of the hardness ratio and the scratch ratio. It can be said that, the higher the toughness evaluation value, the better the toughness. As shown in Table 2, the values were as high as 1.38 to 1.59 in Examples 1 to 13, and as high as 1.56 to 1.59 in Examples 4 to 6, which were particularly excellent.

(Cracking and Peeling Test Under Alcohol Fuel Environment)

Figure 15:
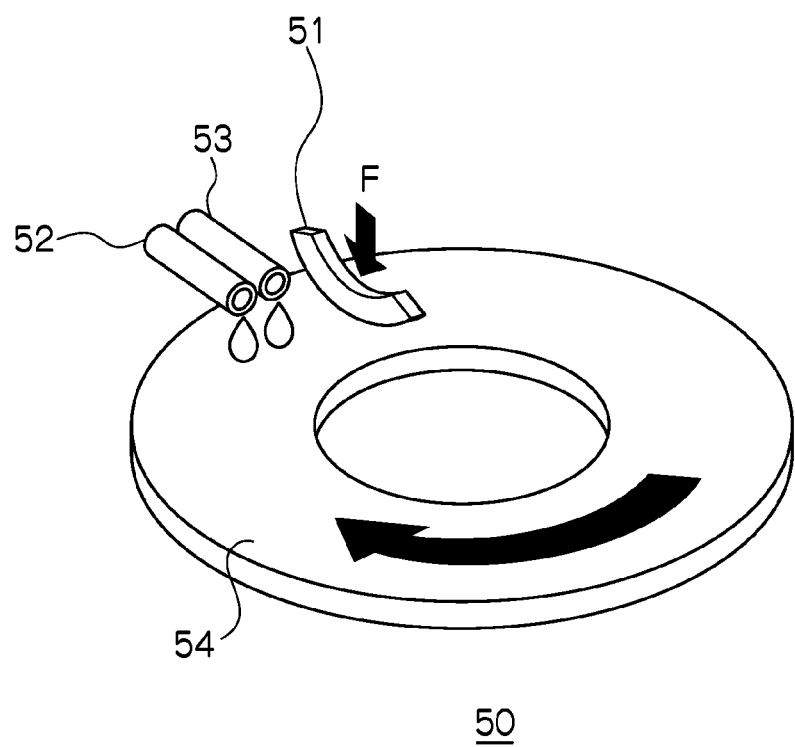
FIG. 15 is an explanatory view of a low-load friction and wear test method under an alcohol environment.

FIG. 15 is an explanatory view of a low-load friction and wear test method under an alcohol fuel environment. This cracking and peeling test was conducted by using a tester 50 that performs the method illustrated in FIG. 15, simultaneously dripping (1 mL/min) an ethanol with 30% water added thereto and an engine oil from dripping tubes 52, 53, respectively, and setting the rotation speed of an opposite material 54 to 1000 rpm. The opposite material 54 was an FC250 material. The outer peripheral sliding surface 11 of the piston ring 10 with the alloy film 3 formed thereon was established as a measurement sample 51, and the predetermined load F was applied. The temperatures of the dripping ethanol and the engine oil were about the same as room temperature. In the test pattern, an applied load (100 N) for 1 second and no load for 1 second were repeated, and the sample surface was observed with a microscope every 10 minutes to determine whether cracking or peeling occurred. The results are shown together in Table 2.

As understood from the results in Table 2, Examples 1 to 13 took approximately 10 hours or more, and are found to have low susceptibility to cracking and peeling. In particular, Examples 4, 11, 12, and 13 including both of the Mn and the Mo took 16 hours or more, and are found to have low susceptibility to cracking and peeling.

It should be noted that, in the examples illustrated here, the more preferable ranges of contents (100% in total) can be exemplified as B content: 0.3 to 0.4 mass %, Ti content: 0.24 to 0.48 mass %, V content: 0.14 to 0.35 mass %, Mo and/or Mn content: 2 mass % or less in total, N content: 30 to 40 mass %, and a remnant of Cr.

DESCRIPTIONS OF REFERENCE NUMERALS

1 Base material
2 Underlayer
2' Nitrided layer
3 Alloy film
3a First alloy film (Intermediate film)
3b Second alloy film (Dense film)
4 Hard carbon film
10, 10A, 10B, 10C, 10D Piston ring
11 Sliding surface (Outer peripheral sliding surface)
12 Upper surface
13 Lower surface
14 Inner peripheral surface
20 Scratch testing device
21 Indenter
22 Table
23 Sample
24 Detector
30 Wear tester
31 Measurement sample
32 Opposite material
33 Lubricating oil
34 Dripping tube
40 Ball-on-disk friction and wear tester
41 Rotating disk
42 Fixed ball
43 Spindle
44 Test sample
50 Low-load friction and wear tester
51 Measurement sample
52, 53 Dripping tube
54 Opposite material
P, F Load

What is claimed is:
1. A sliding member comprising:
a sliding surface coated with a Cr—B—Ti—V—(Mn, Mo)—N-based alloy film containing one or both of Mn and Mo and having a total content of the Mn and the Mo within a range of 0.1-2 mass %,
a B content is within a range of 0.1 mass % to 1.5 mass %, inclusive, a V content is within a range of 0.05 mass % to 1 mass %, inclusive, and a Ti content is within a range of 0.05 mass % to 1.5 mass %, inclusive, and
an N content is within a range of 30 mass % to 40 mass %, inclusive, and a remnant includes Cr and inevitable impurities; wherein
a toughness evaluation value of a Cr—N alloy coating without B—Ti—V—(Mn,Mo) is 1;
the toughness evaluation value of said Cr—B—Ti—V—(Mn,Mo)—N alloy coating is 1.41 to 1.59,
the toughness evaluation value is the value obtained by multiplying a hardness ratio by a scratch ratio, wherein the hardness ratio is expressed as a relative value of the Vickers hardness value of the Cr—B—Ti—V—(Mn, Mo)—N alloy coating when the Vickers hardness of the Cr—N alloy coating without B—Ti—V—(Mn,Mo) is 1, and the scratch ratio is expressed as a relative value of the scratch ratio of the Cr—B—Ti—V—(Mn, Mo)—N alloy coating when the scratch ratio of the Cr—N alloy coating without B—Ti—V—(Mn,Mo) is 1, said Vickers hardness is measured by a Vickers hardness tester in accordance with the standards JIS B 7725, ISO 6507 HV(0.05), and the scratch ratio is measured using a scratch test device to determine a limit load at which peeling of the alloy film occurs when a force is applied parallel to the alloy film on a table at a table speed of 10 mm/min, and the scratch test device comprises an indenter having a load loading speed of 100 N/min, indenter tip R of 0.2 mm, and test load of 0 to 100N; the alloy film is pressed against a test specimen of SKH51; and the scratch ratio is determined from a scratch load measured by an AE (acoustic emission) generation detected by an AE detector with a sensitivity of 1.2 when the test specimen is moved a distance of 5 m.

2. The sliding member according to claim 1, wherein the Cr—B—Ti—V—(Mn, Mo)—N-based alloy film is configured by a first alloy film provided on a base material side, and a second alloy film is provided on the first alloy film.

3. The sliding member according to claim 1, wherein a hard carbon film is further provided on the Cr—B—Ti—V—(Mn, Mo)—N-based alloy film.

4. The sliding member according to claim 1, wherein a nitriding treatment layer or a metal underlayer is provided as an underlayer of the Cr—B—Ti—V—(Mn, Mo)—N-based alloy film.

5. The sliding member according to claim 1, wherein the sliding member is a piston ring for an internal combustion engine.

6. The sliding member according to claim 1, wherein the Cr—B—Ti—V—(Mn, Mo)—N-based alloy film consists of Cr, B, Ti, V, N, one or both of Mn and Mo, and inevitable impurities.

7. The sliding member according to claim 1, wherein when the scratch ratio of the Cr—N alloy coating without B—Ti—V—(Mn,Mo) is 1, the scratch ratio of said Cr—B—Ti—V—(Mn,Mo)—N alloy coating is 1.10 to 1.23.

8. The sliding member according to claim 1, wherein when the scratch ratio of the Cr—N alloy coating without B—Ti—V—(Mn,Mo) is 1, the scratch ratio of said Cr—B—Ti—V—(Mn,Mo)—N alloy coating is 1.11 to 1.23.

* * * * *